US006810125B2

(12) United States Patent
Oster et al.

(10) Patent No.: US 6,810,125 B2
(45) Date of Patent: Oct. 26, 2004

(54) MICROPHONE EMULATION

(75) Inventors: Doran Oster, Gainesville, FL (US); Gary Miller, Gainesville, FL (US); Boris Lerner, Sharon, MA (US)

(73) Assignee: Sabine, Inc., Alachua, FL (US)

( * ) Notice: Subject to any disclaimer, the term of this patent is extended or adjusted under 35 U.S.C. 154(b) by 444 days.

(21) Appl. No.: 10/061,318

(22) Filed: Feb. 4, 2002

(65) Prior Publication Data

US 2003/0147540 A1 Aug. 7, 2003

(51) Int. Cl.[7] .............................. H03G 3/00; H04R 3/00
(52) U.S. Cl. .......................... 381/111; 381/103; 381/61
(58) Field of Search ................... 381/92, 111, 112–115, 381/103, 61, 58, 91; 700/94

(56) References Cited

U.S. PATENT DOCUMENTS 3,604,853 A 9/1971 Pless
4,378,467 A 3/1983 Ferrantelli
4,631,749 A 12/1986 Rapaich
4,995,084 A * 2/1991 Pritchard ..................... 381/61
5,206,913 A 4/1993 Sims
5,241,696 A 8/1993 Mori et al.
5,450,312 A 9/1995 Lee et al.
5,511,129 A 4/1996 Craven et al.
5,710,820 A * 1/1998 Martin et al. ............... 381/321
6,026,170 A * 2/2000 Dieken et al. ................ 381/67
6,084,973 A * 7/2000 Green et al. .................. 381/92
6,697,493 B1 * 2/2004 Kern .......................... 381/111
2003/0194099 A1 * 10/2003 Huang et al. ............... 381/111

* cited by examiner

*Primary Examiner*—Minsun Oh Harvey
*Assistant Examiner*—Laura A. Grier
(74) *Attorney, Agent, or Firm*—Donald W. Marks

(57) ABSTRACT

An emulation circuit includes a digital signal processor with a digital filter controlled by frequency response conversion parameters for converting a standard microphone signal into a signal emulating the frequency response of one of a plurality of microphones selected by a selector connected to the digital signal processor. Optionally the conversion parameters can also include phase response conversion parameters. The emulation circuit can be included in a receiver for a wireless microphone or in a microphone itself.

8 Claims, 5 Drawing Sheets

MICROPHONE EMULATION

BACKGROUND

The present invention relates to frequency responses of microphones and particularly to changing the frequency response.

Microphones employ transducers, such as dynamic transducers, condenser transducers, electret transducers, solid state transducers, and other types of transducers, to convert impinging sound energy (pressure waves in air) into electrical signals which can be amplified and broadcast to an audience or applied to recording equipment to record a performance. Ideally, the electrical signals from the transducer are directly proportional to the sound energy arriving at the microphone at all frequencies across the audio spectrum, i.e., a flat frequency response from about 20 to 20,000 Hz. However all types of microphone transducers, and other microphone elements such as the microphone head affecting the sound energy, are mechanical devices which respond differently to different frequencies of sound energy and thus fail to produce a flat frequency response. Furthermore some microphones are intentionally designed to increase and/or decrease certain portions of the audio spectrum. Often equalizer circuits are employed to attenuate selected portions of the frequency spectrum in the electrical signals from microphones to increase the flatness of the response or to produce a desired change in the frequency response.

Different brands and types of commercially available microphones differ in frequency response. Often a musician prefers one brand and/or type of microphone that best suits his/her voice and style. Sometimes musicians use several different brands and types of microphones during a recording session or a performance to add color and variety to the performance. Concert hall engineers are often required to stock an extensive inventory of microphones or microphone heads so that they can accommodate the request of each artist who performs in their concert halls and studios. This is expensive especially for performers who require wireless microphones.

Additionally the mechanical portions of microphones must move in response to the impinging sound energy and, due to the inertia of these mechanical elements, the phase of the electrical signals produced by microphones varies with frequency. This microphone phase response is different for different brands and types of microphones. Although a different phase response is discernible to a lesser degree than a different frequency response, the sound reproduced and broadcast from the different microphones differs due to the different phase responses of the microphones.

There is a commercially available unit which can be plugged serially in a microphone cord for converting electrical signals from one brand or type of microphone to emulate another brand or type of microphone.

SUMMARY OF THE INVENTION

The invention is summarized in a circuit for changing electrical signals generated by a microphone into signals emulating the frequency response of another selected microphone by digitally filtering the microphone signals. The circuit includes an analog to digital converter which digitizes the microphone signals for processing by a digital signal processor based upon a set of processing parameters selected by a selector from a memory containing a plurality of sets of the processing parameters corresponding to different brands or types of microphones.

Each set of processing parameters is generated by a calibrated evaluation of the frequency response of two microphones, the microphone be used and the microphone being emulated. The differences between the frequency responses of the two microphones is used to produce the processing parameters such as digital filter parameters used by the digital signal processor to change the digitized electrical signals.

The emulation circuit is particularly useful when wireless microphones are employed. The emulation circuit can be incorporated in either the receiver or the wireless microphone itself

DETAILED DESCRIPTION OF THE INVENTION

Figure 1:
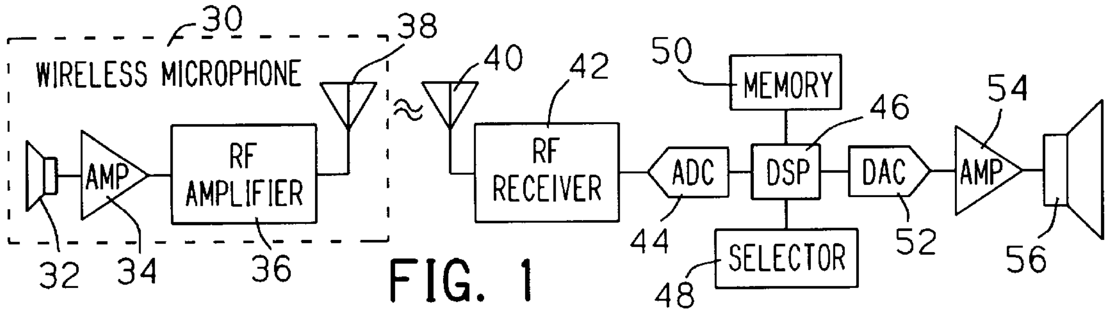
FIG. 1 is a block diagram of one embodiment of a wireless microphone and receiver circuit including an emulation circuit in accordance with the invention.
Figure 2:
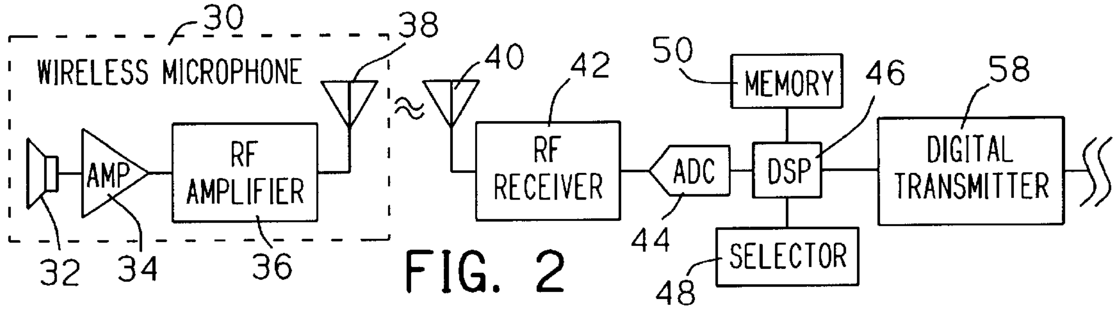
FIG. 2 is a block diagram of a second embodiment of a wireless microphone and receiver circuit including an emulation circuit in accordance with the invention.

As shown in FIG. 1, a wireless microphone 30 includes a transducer 32 for converting impinging sound waves into electrical signals. An amplifier 34 receives the electric signals and amplifies the electrical signals to a suitable level to modulate a RF amplifier 36 that drives antenna 38 to transmit the electrical signals by electromagnetic energy. The radio frequency signals are picked up by a receiver antenna 40 and applied to a RF receiver 42 where the signals are demodulated. An analog to digital converter 44 digitizes the received signals that are then processed by a digital signal processor (DSP) 46 to convert the frequency response of the microphone 30 to the frequency response of a different microphone selected by a selector 48 connected to the DSP. A memory 50 connected to or incorporated in the DSP 50 contains a set of conversion parameters for the selected microphone along with sets of conversion parameters for other microphones that can be selected by the selector 48. The digital signals converted by the DSP 46, in the illustrated embodiment of FIG. 1 are converted back to an analog signal by a digital to analog converter 52. This analog signal can be amplified by an amplifier 54 to drive a speaker 56 for broadcast to an audience. Alternatively the output of the digital to analog converter 52 can be applied to a recording device (not shown) for recording sounds received by the microphone 30. In a still further embodiment shown in FIG. 2, the output of the converted digital output of the DSP 40 is connected to a digital transmitter 58 that transmits the digital signal to other processing circuitry (not shown) or a recording device (not shown).

The memory 50 contains a plurality of sets of the conversion parameters, such as digital filter parameters, corresponding to a plurality of microphones from which the microphone to be emulated is selected. The memory can be a ROM incorporated in the DSP, a ROM external to the DSP, a hard disc, a floppy disc, a CD ROM or other memory device which can store conversion parameters that can be read and incorporated into software such as a digital filter in the DSP. The selector 48 can be a DIP or rotating switch, a keyboard or keypad associated with a monitor or display, or any other type of device that can be used to select the desired microphone conversion parameters. When the selector is a switch, the switch is set to select the microphone to be emulated. When the selector is a keyboard or keypad, the keyboard or keypad is used to select the microphone to be emulated from a displayed list of microphones.

Figure 5:
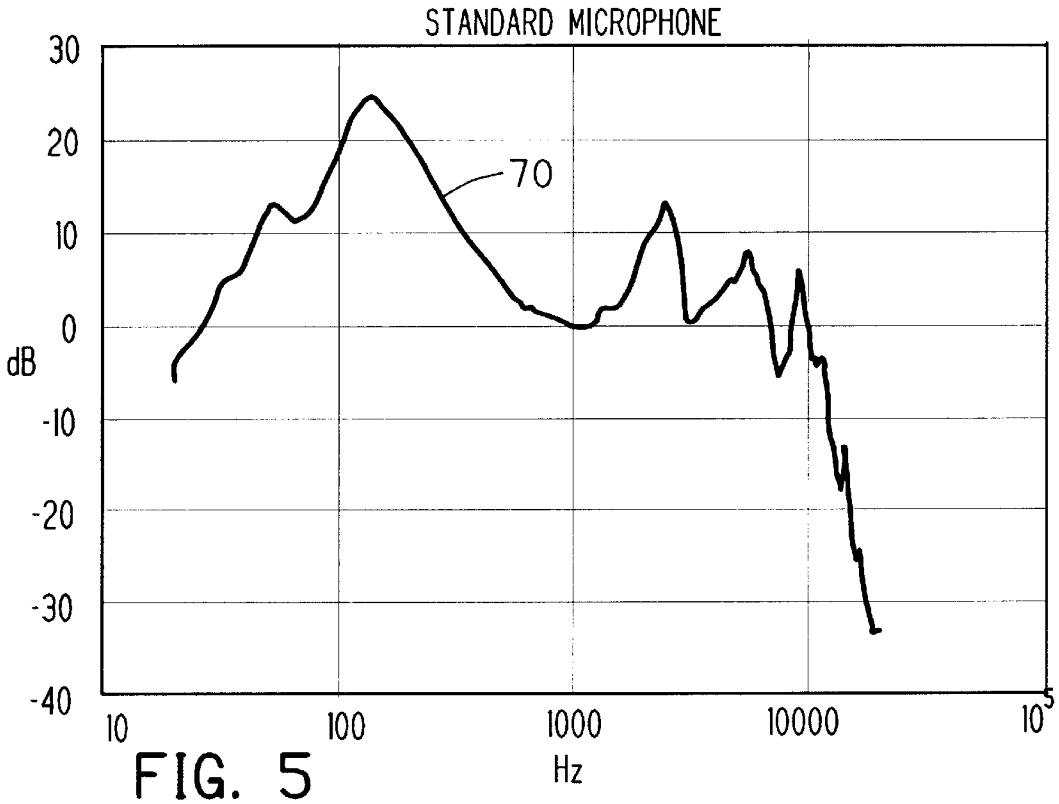
FIG. 5 is a graph illustrating a frequency response of one microphone that can be used in the invention.
Figure 6:
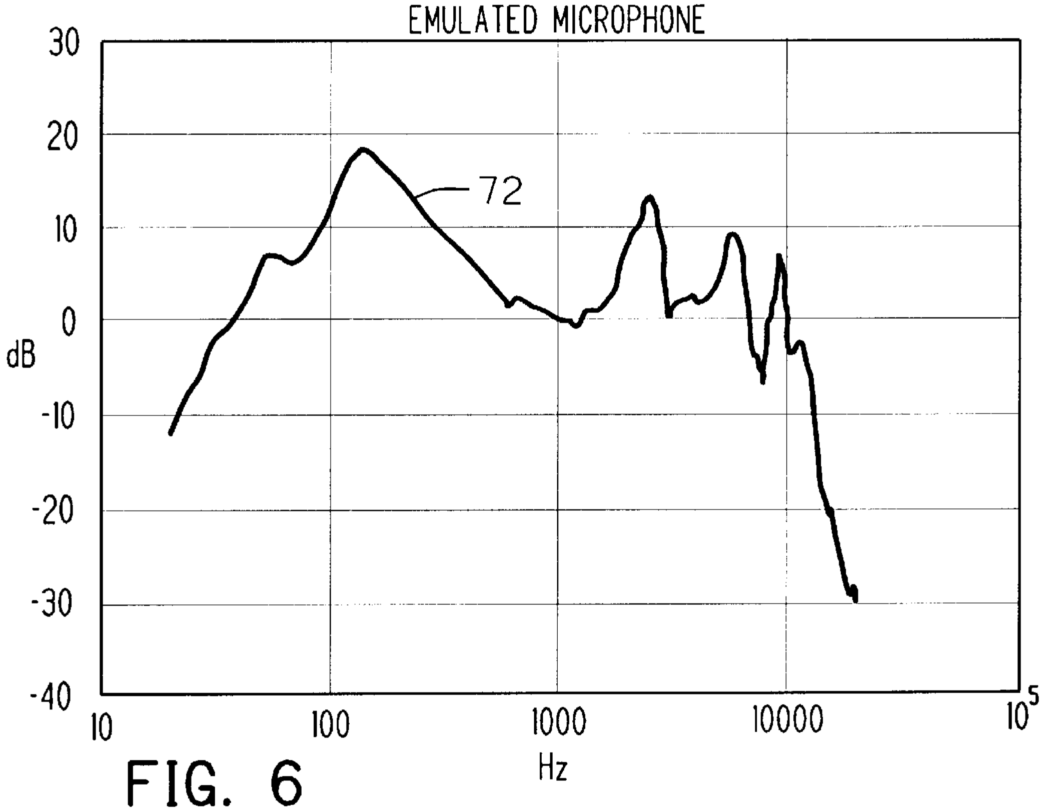
FIG. 6 is a graph illustrating a frequency response of a second microphone that can be emulated by the invention.
Figure 7:
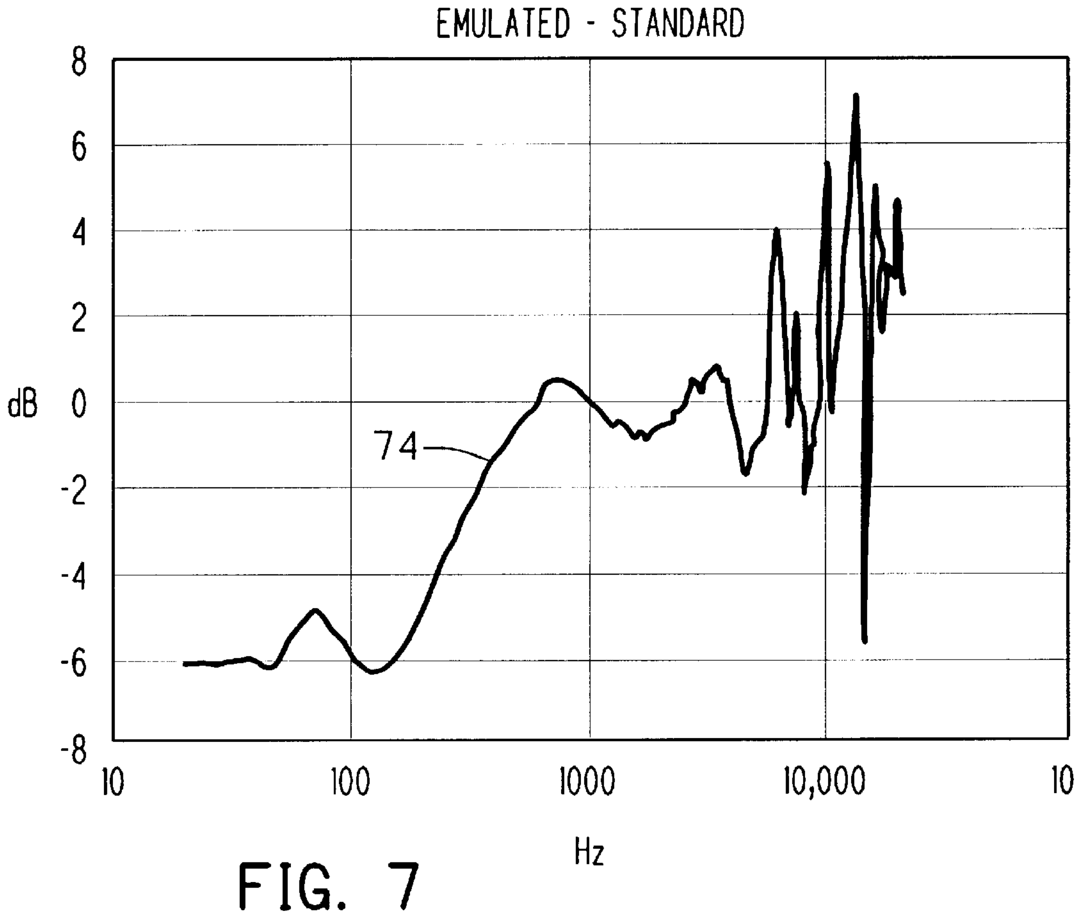
FIG. 7 is a graph illustrating the differences in frequency responses of FIGS. 5 and 6.
Figure 9:
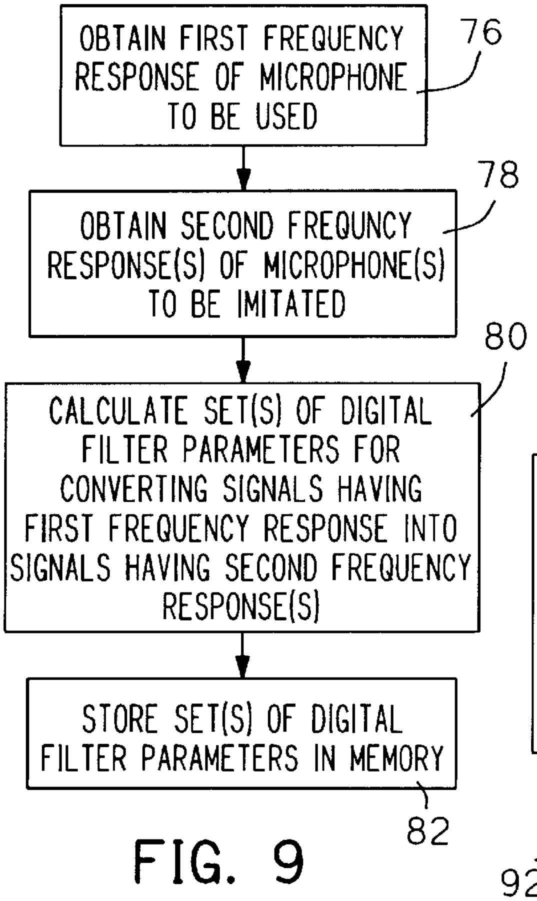
FIG. 9 is step flow chart of a procedure used to obtain and store one embodiment of filter parameters used by the emulation circuits in accordance with the invention.

Curve 70 in FIG. 5 illustrates one possible frequency response of the microphone 30 (standard microphone) while curve 72 in FIG. 6 illustrates a possible frequency response of a microphone to be emulated (emulated microphone) by the emulation circuit. The differences between the frequency responses of FIGS. 5 and 6 are shown by the curve 74 in FIG. 7 (emulated—standard). In a first step 76 in FIG. 9, the frequency response of the microphone 30 is obtained. This is done by placing the microphone in a near-anachoic chamber having a calibrated sound source (speaker). A sine wave tone at each frequency or band of frequencies of the audio frequency spectrum (for example, 20 Hz to 20,000 Hz) at a desired resolution is generated by the sound source and the signal magnitudes produced by the microphone are measured to generate a frequency response such as represented by curve 70. Step 78 performs similar measurements of the frequency response of each microphone that is to be emulated. Curve 72 is representative of one such frequency response to be emulated. In step 80, a set of digital filter parameters is calculated using the differences of each emulated microphone frequency response from the standard microphone frequency response, such as the differences represented by curve 74. Copies of the set or sets of digital filter parameters generated in step 80 are stored in step 82 in the memory 50.

Figure 8:
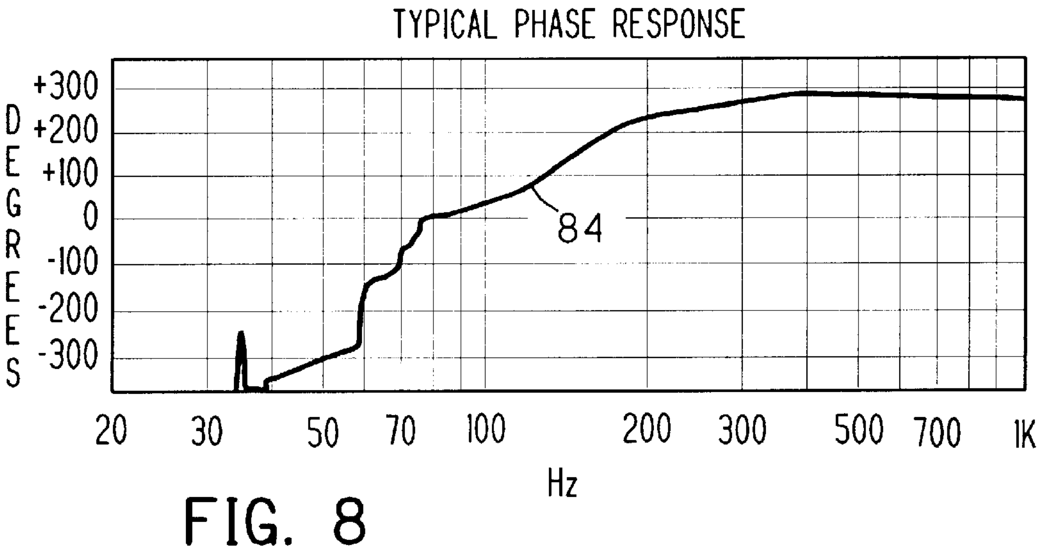
FIG. 8 is a graph illustrating a typical phase response of a microphone.
Figure 10:
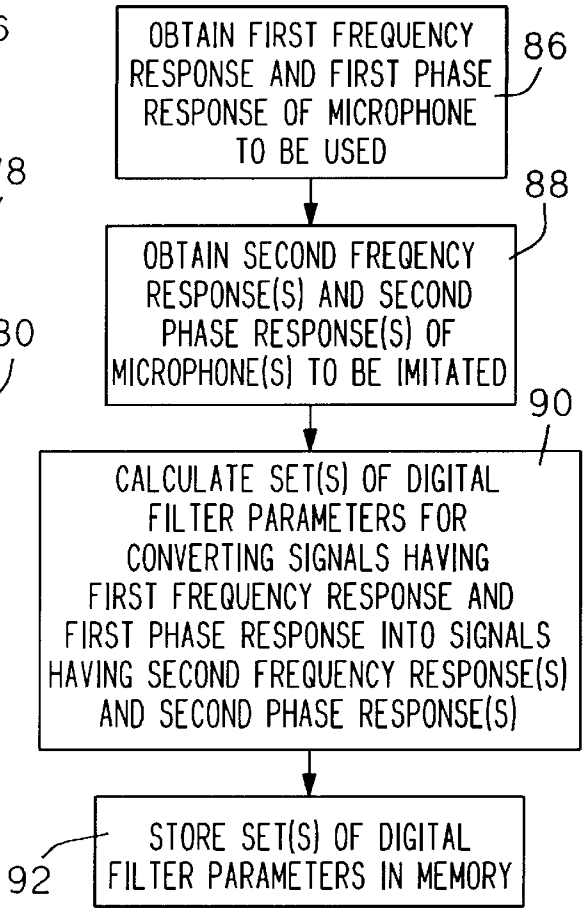
FIG. 10 is step flow chart of one alternative procedure used to obtain and store filter parameters used by the emulation circuits in accordance with the invention.

A typical phase response of a microphone is illustrated by curve 84 in FIG. 8. In an alternative embodiment shown in FIG. 10, step 86 obtains both the frequency response and the phase response of the standard microphone 30. Then is step 88, both the frequency response and the phase response of each microphone to be emulated is obtained. Calculation of a set or sets of digital filter parameters for converting the signals from the microphone 30 into signals having the emulated frequency and phase responses is performed in step 90. Each calculated set is stored in step 92.

Figure 11:
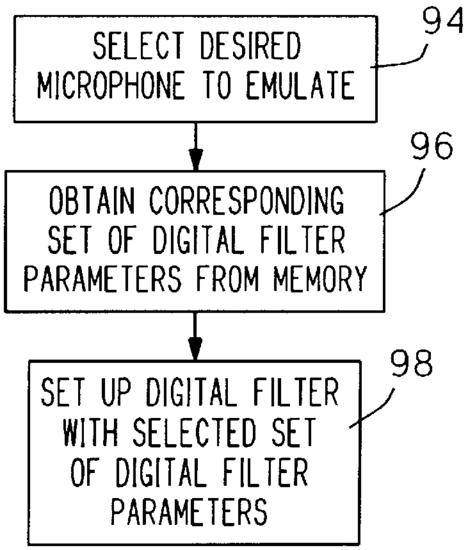
FIG. 11 is a step flow chart of a procedure employed by a data signal processor in the circuits in accordance with the invention.
Figure 12:
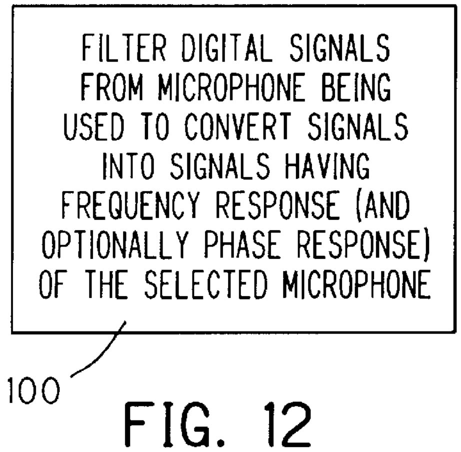
FIG. 12 is a step flow chart of another procedure employed by the data signal processor in the circuits in accordance with the invention.

At the start of a performance or at a change in a performance using the standard microphone 30, the microphone to be emulated is selected in step 94 of FIG. 11, for example by setting a switch or entering a selection on a keyboard or keypad. Then is step 96, the set of digital filter parameters corresponding to the selected microphone being emulated is read from the memory 50. The read parameters are set in a digital filter in the signal processor 46. Thereafter during operation of the microphone 30, the microphone signal received by the receiver 42 is filtered such as by step 100 in FIG. 12 in the DSP 46 so that the signal output of the DSP emulates the selected microphone.

Figure 3:
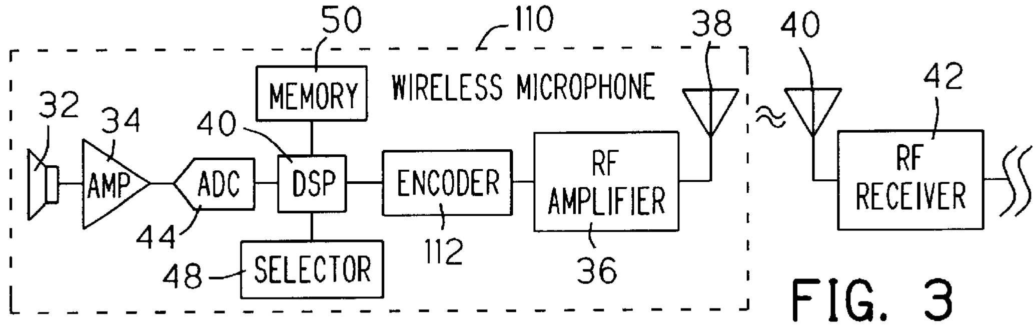
FIG. 3 is a block diagram of a third embodiment of a wireless microphone and receiver circuit including an emulation circuit in accordance with the invention.

FIG. 3 shows a modified wireless microphone 110 that includes the emulation circuit so that the emulation processing is performed in the microphone itself prior to transmission to the receiver. In this embodiment, the analog to digital converter 44 is connected to the output of the amplifier 34 which sets the signal level to a level suitable for the analog to digital converter. Also this embodiment includes an encoder circuit 112 for encoding the digital signal prior to transmission so that the source of the signal can be readily recognized by decoding circuitry (not shown) associated with the receiver 42 to separate the transmitted signal from other signals transmitted by other microphones.

Figure 4:
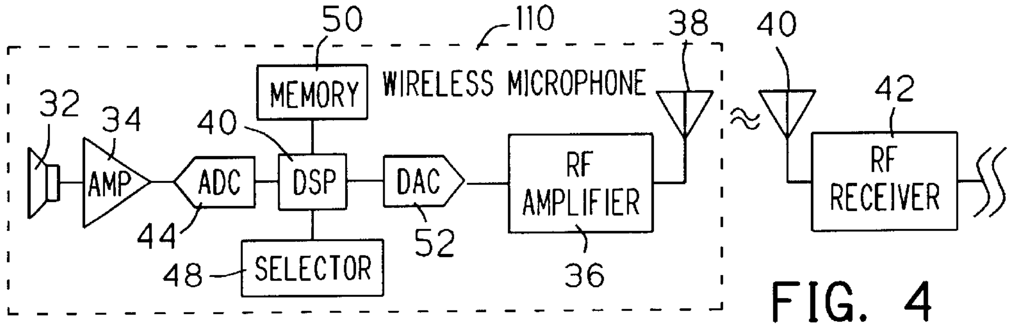
FIG. 4 is a block diagram of a fourth embodiment of a wireless microphone and receiver circuit including an emulation circuit in accordance with the invention.

FIG. 4 illustrates conversion of the converted digital signal back into an analog signal by the digital to analog converter 52 prior to transmission by the microphone 110.

Figure 13:
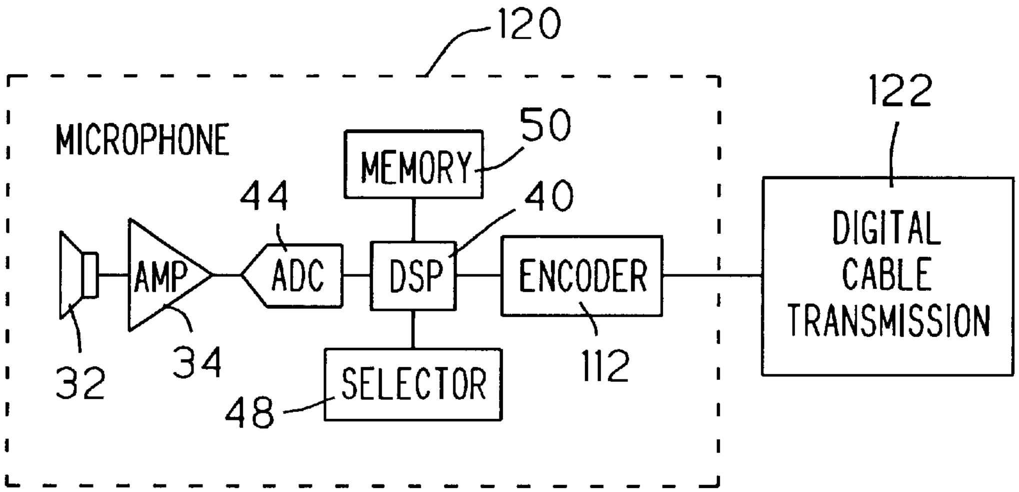
FIG. 13 is a block diagram of a fifth embodiment of a microphone including an emulation circuit in accordance with the invention.
Figure 14:
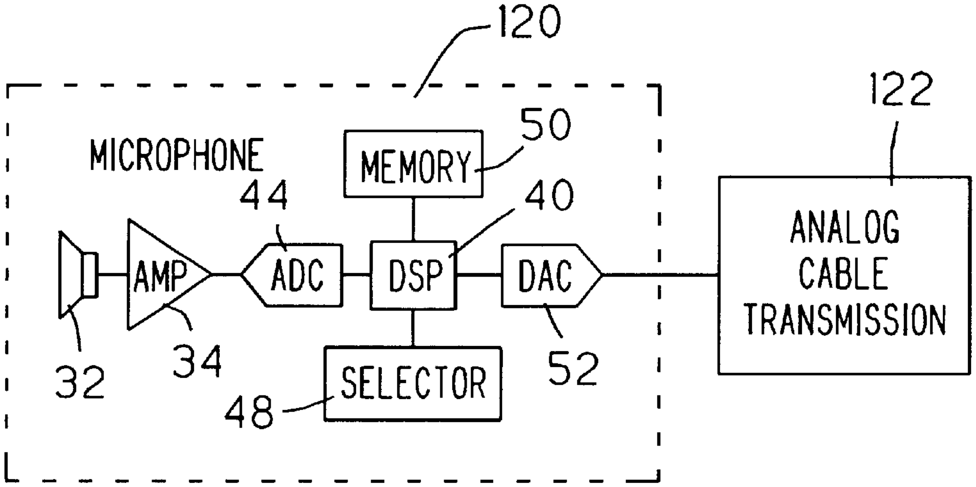
FIG. 14 is a block diagram of a sixth embodiment of a microphone including an emulation circuit in accordance with the invention.

FIGS. 13 and 14 show microphones 120 including the emulation circuit but with the transmission of either the converted digital signal (FIG. 13) or the converted analog signal (FIG. 14) over a cable 122.

Since many variations, modifications and changes in detail can be made to the above described embodiments, it is intended that the foregoing description be interpreted as only illustrative of the invention and not in a limiting sense.

What is claimed is:

1. A conversion circuit for converting a microphone signal into a signal emulating a different microphone response, comprising:

an analog to digital converter receiving an analog microphone signal for converting the signal into a digitized microphone signal;

a selector for selecting a desired microphone to be emulated from a plurality of different microphones;

a memory containing a plurality of sets of conversion parameters, each set for converting the digitized microphone signal into a signal emulating a corresponding one of the plurality of different microphones;

a digital signal processor for receiving the digitized microphone signal;

means for loading the corresponding conversion parameters from the memory into the digital signal processor; and means for operating the digital signal processor based on the loaded conversion parameters to convert the digitized microphone signals into a converted digitized signal emulating the selected microphone.

2. A conversion circuit as claimed in claim 1 wherein the digital signal processor includes a digital filter and the sets of conversion parameters are sets of digital filter parameters.

3. A conversion circuit as claimed in claim 1 wherein the conversion parameters include parameters for converting a frequency response of a standard microphone generating the microphone signals into a frequency response emulating the selected microphone.

4. A conversion circuit as claimed in claim 3 wherein the conversion parameters include parameters for converting a phase response of the standard microphone into a phase response emulating the selected microphone.

5. A wireless microphone receiver circuit comprising:

an RF receiver for receiving a wireless microphone signal having a frequency response of a standard microphone;

a digital signal processor for receiving the wireless microphone signal;

a memory having a plurality of sets of frequency response conversion parameters corresponding to different microphones;

a selector connected to the digital signal processor for selecting one of the different microphones to be emulated; and said digital signal processor operating in accordance with the set of frequency response conversion parameters corresponding to the selected microphone to convert the wireless microphone signal into a signal having a frequency response emulating the selected microphone.

6. A wireless microphone receiver as claimed in claim 5 wherein the memory also has phase response conversion parameters corresponding to the different microphones and the digital signal processor operates in accordance with phase response conversion parameters corresponding to the selected microphone to convert the wireless signal into a signal having a phase response emulating the selected microphone.

7. A microphone comprising:

a transducer for converting sound energy into an electrical signal in accordance with a standard frequency response;

an analog to digital converter for converting the electrical signal into a digitized microphone signal;

a digital signal processor receiving the digitized microphone signal;

a selector connected to the digital signal processor for selecting one of a plurality of different microphones to be emulated;

a memory containing a plurality of sets of frequency response conversion parameters for converting the digitized microphone signal into converted signals having a frequency response corresponding to the different microphones; and said digital signal processor controlled by the conversion parameters of the selected microphone for converting the digitized microphone signal into a signal emulating the frequency response of the selected microphone.

8. A microphone as claimed in claim 7 wherein the memory also has phase response conversion parameters corresponding to the different microphones and the digital signal processor operates in accordance with phase response conversion parameters corresponding to the selected microphone to convert the wireless signal into a signal having a phase response emulating the selected microphone.

* * * * *